United States Patent [19]

Tateno et al.

[11] Patent Number: 4,589,010
[45] Date of Patent: May 13, 1986

[54] METHOD FOR MANUFACTURING A PLASTIC ENCAPSULATED SEMICONDUCTOR DEVICE AND A LEAD FRAME THEREFOR

[75] Inventors: Kenichi Tateno, Shiga; Masami Yokozawa, Kyoto; Hiroyuki Fujii, Osaka; Mikio Nishikawa, Kyoto; Michio Katoh, Osaka; Fujio Wada, Kyoto, all of Japan

[73] Assignee: Matsushita Electronics Corporation, Osaka, Japan

[21] Appl. No.: 581,251

[22] Filed: Feb. 17, 1984

Related U.S. Application Data

[62] Division of Ser. No. 367,809, Apr. 13, 1982, Pat. No. 4,451,973.

[30] Foreign Application Priority Data

Apr. 28, 1981 [JP] Japan ................................ 56-64893
Apr. 30, 1981 [JP] Japan ................................ 56-64307

[51] Int. Cl.4 ..................... H01L 23/30; H01L 23/12; H01L 23/10
[52] U.S. Cl. ....................................... 357/70; 357/72; 357/68
[58] Field of Search ..................... 357/70, 81, 72, 80, 357/68

[56] References Cited

U.S. PATENT DOCUMENTS

| | | | |
|---|---|---|---|
| 2,965,819 | 12/1960 | Rosenbaum | 357/81 |
| 3,431,092 | 3/1969 | Lehner | 357/81 |
| 3,881,241 | 5/1975 | Masuda et al. | 357/70 |
| 3,930,114 | 12/1975 | Hodge | 357/72 |
| 4,250,347 | 2/1981 | Fierkens | 357/72 |
| 4,301,464 | 11/1981 | Otsuki et al. | 357/72 |
| 4,322,737 | 3/1982 | Sliwa, Jr. | 357/65 |
| 4,331,740 | 5/1982 | Burns | 357/70 |
| 4,482,915 | 11/1984 | Nishikawa et al. | 357/72 |

FOREIGN PATENT DOCUMENTS

| | | | |
|---|---|---|---|
| 0038885 | 3/1977 | Japan | 357/68 |
| 0055065 | 5/1981 | Japan | 357/70 |
| 57-5351 | 1/1982 | Japan | 357/72 |
| 0877674 | 9/1961 | United Kingdom | 357/65 |

Primary Examiner—Andrew J. James
Assistant Examiner—S. V. Clark
Attorney, Agent, or Firm—Burgess, Ryan & Wayne

[57] ABSTRACT

A method for manufacturing a plastic encapsulated semiconductor device is provided which comprises the steps of: clamping by upper and lower molds at least external leads and strips of a semiconductor device assembly formed using a lead frame which has a first connecting band connected to the external leads extending from one side of a substrate support further used as a heat sink, and a second connecting band connected to the strips having portions of small cross-sectional areas and of a predetermined length and extending from the other side of the substrate support, the cross sections being perpendicular to an extending direction of the strips, so that the substrate support may float in a cavity formed by the upper and lower molds and parts of the portions of small cross-sectional areas may be disposed in the cavity and the remaining parts thereof may be disposed between the upper and lower molds; injecting a plastic into the cavity; and cutting the portions of small cross-sectional areas of the strips which extend outside a plastic encapsulating housing along the end face of the plastic encapsulating housing and cutting a connecting portion between the external leads and the first connecting band. Also provided is a lead frame having the strips as decribed above. A plastic layer of desired thickness can be formed on the rear surface of the substrate support. Cutting of the strips from the plastic encapsulating housing is easy and reliable.

10 Claims, 16 Drawing Figures

METHOD FOR MANUFACTURING A PLASTIC ENCAPSULATED SEMICONDUCTOR DEVICE AND A LEAD FRAME THEREFOR

This is a division of application Ser. No. 367,809, filed Apr. 13, 1982, now U.S. Pat. No. 4,451,973.

BACKGROUND OF THE INVENTION

I. Field of the Invention

The present invention relates to a method for manufacturing a plastic encapsulated semiconductor device which can be used with relatively large power and a lead frame therefor.

II. Description of the Prior Art

Plastic encapsulated semiconductor devices are superior to metal encapsulated semiconductor devices in ease in mass production and manufacturing costs. However, the plastic encapsulated semiconductor devices are inferior to the metal encapsulated semiconductor devices in radiation of heat when they are operated. Plastic encapsulation of semiconductor devices has recently been developed. A high power transistor manufactured by plastic encapsulation has been proposed. In this case, sufficient consideration is taken to allow the radiation of heat.

In a transistor adhered on a metal substrate support and encapsulated by plastic, for example, the lower surface of the substrate support is not covered with plastic but exposed. The substrate support is mounted on a radiator to radiate heat. However, in this case, the substrate support must be electrically insulated from the radiator. The packaging operation of the semiconductor device on the radiator through an insulating plate is complicated and cumbersome.

On the other hand, a plastic encapsulated power transistor is proposed wherein a thin plastic layer is formed on the lower surface of the substrate support during plastic encapsulation and an insulating plate is not required for mounting the power transistor on the radiator. However, in this case, at the time of plastic encapsulation, only the side of the lead frame from which extend the external lead is clamped by the upper and lower molds with a transistor assembly which has the external lead on one side. Plastic is injected while the substrate support is floating in a cavity defined by the molds. Thus, the substrate support may be bent in the cavity due to the injection pressure of the plastic. As a result, it is very difficult to encapsulate in plastic while keeping the substrate support in a proper position, thus, resulting in non-uniformity in the thickness of the plastic layer on the lower surface of the substrate support and degrading radiation characteristics.

SUMMARY OF THE INVENTION

It is an object of the present invention to provide a method for manufacturing a plastic encapsulated semiconductor device and a lead frame therefor wherein, in manufacturing a plastic encapsulated semiconductor device of a structure which has a thin plastic layer on one surface of a substrate support which supports a semiconductor substrate and also serves as a heat sink, to the other surface of which the semiconductor substrate is adhered, the thickness of the thin plastic layer is uniformly formed and with high precision.

In order to achieve the above object of the present invention, there is provided a method for manufacturing a plastic encapsulated semiconductor device and a lead frame therefor wherein a semiconductor device assembly is formed, using a lead frame an external lead of which extends to one side of a substrate support and strips of which extend to the other end of the substrate support, said strips each having a portion of cross-sectional area are made small for a predetermined length, the cross sections being perpendicular to the extending direction of said strips; the external lead and strips are clamped by upper and lower molds so as to float the substrate support in a cavity of the molds and to position part of the portion of each of the strips with small cross-sectional area in the cavity of the molds and the remaining part of the portion of each of the strips between the molds for plastic encapsulation, and a connecting portion between a first connecting band and the external lead and the portion of each of the strips with small cross-sectional area extending from a plastic encapsulating housing to the outside are cut.

The substrate support is, therefore, supported properly at the time of plastic encapsulation. The substrate support may not be bent due to injection pressure of the plastic, so that a plastic layer is uniformly formed on the rear surface of the substrate support with high precision. Further, the portions of the strips with small cross-sectional areas are easily cut without damaging the encapsulating housing.

The above and other objects and features of the present invention will become apparent from the following detailed description of the preferred embodiments when taken in conjunction with reference to the accompanying drawings.

DETAILED DESCRIPTION OF THE PRIOR ART

Figure 1:
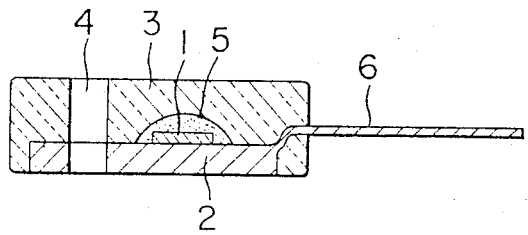
FIGS. 1 and 2 are sectional views showing the structures of conventional plastic encapsulated power transistors, respectively.

FIG. 1 is a sectional view of a conventional power transistor of the plastic encapsulated structure. The lower surface of a substrate support 2 on which a transistor element 1 is adhered and which serves as a heat sink is not covered with a plastic encapsulating housing 3 but exposed. A through hole 4 is formed for mounting the power transistor on the radiator with a screw. Reference numeral 5 denotes a protective plastic portion and reference numeral 6 denotes an external lead. When the plastic encapsulated power transistor with the above structure is to be mounted on the radiator (not shown), the exposed lower surface of the substrate support 2 must be thermally coupled with the radiator but must be electrically insulated therefrom. This electrical insulation may be performed by insertion of an insulating plate such as a mica plate.

With the above structure, the heat radiation effect is guaranteed. However, the insulating plate must be inserted between the radiator and the substrate support when the substrate support is to be mounted on the radiator, resulting in a complicated packaging operation. Furthermore, the insulating plate must be properly inserted between the radiator and the substrate support. When the insulating plate, the radiator and the substrate support are to be integrally adhered, they may be misaligned. Thus, electrical insulation cannot be guaranteed. Therefore, as shown in FIG. 2, a plastic encapsulated power transistor is proposed wherein a thin plastic layer 7 is formed on the lower surface of the substrate support 2 and the insulating plate is not required.

Figure 2:
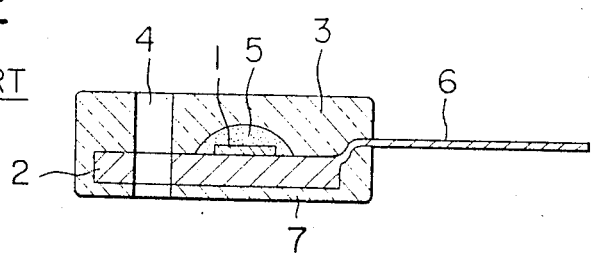
Figure 3:
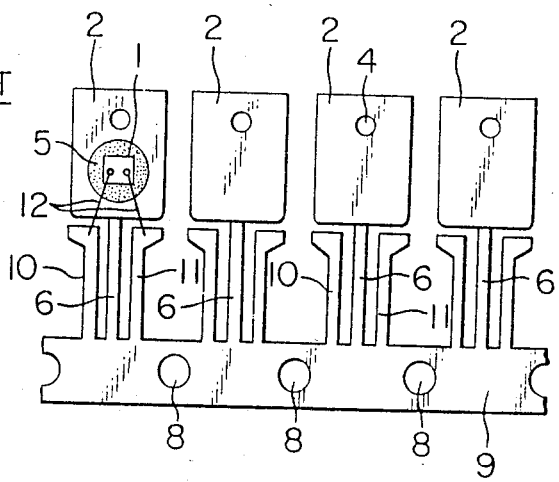
FIG. 3 is a plan view of a conventional lead frame.
Figure 4:
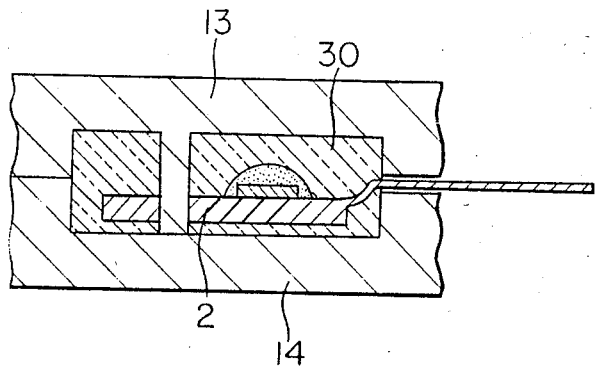
FIG. 4 is a view illustrating the state of plastic encapsulation for forming the plastic encapsulated power transistor of FIG. 2 using the lead frame of FIG. 3.

FIG. 3 is a plan view of a lead frame which is conventionally used for packaging the plastic encapsulated power transistor of FIGS. 1 and 2. External leads 6, 10 and 11 of the power transistor extend in one direction from a connecting band 9 on which apertures 8 for determining the feed pitch and positioning the substrate support 2 at the time of plastic encapsulation are formed. As shown in FIG. 4, the substrate support 2 is connected to the end of the external lead 6. As shown in the leftmost transistor, the transistor is packaged in such a manner that the transistor element 1 is adhered, metal wires 12 are connected between the external leads 10 and 11 and electrodes of the transistor element 1 corresponding thereto, and a protective plastic portion 5 is formed.

A transistor assembly is obtained, using the lead frame as described above. This transistor assembly is formed into a plastic encapsulated structure shown in FIG. 2 in the following manner. As shown in FIG. 4, the substrate support 2 of the transistor assembly is floated in a cavity formed between an upper mold 13 and a lower mold 14. Plastic 30 is then injected into the cavity. The plastic 30 is also filled in the cavity immediately under the lower surface of the substrate support 2. Thus, the plastic encapsulated semiconductor device of FIG. 2 is manufactured.

As is apparent from FIG. 4, when the plastic encapsulated structure of FIG. 2 is to be obtained by using the lead frame of FIG. 3, plastic is injected into the cavity while only the side on which the external leads are formed is clamped between the upper and lower molds. The substrate support 2 may be bent within the cavity due to the injection pressure of the plastic. Therefore, it is very difficult to dispose the substrate support 2 in a proper position. If the substrate support 2 is bent, the uniform thickness of the thin plastic layer 7 is not obtained. Further, this non-uniformity in thickness directly results in degradation of radiation characteristics.

DESCRIPTION OF THE PREFERRED EMBODIMENTS

Figure 5A:
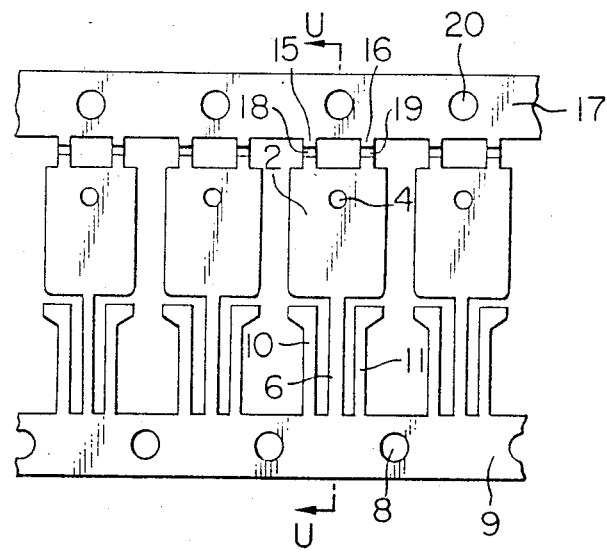
FIGS. 5A and 5B are a plan view and a sectional view, respectively, of a lead frame according to one embodiment of the present invention.
Figure 5B:
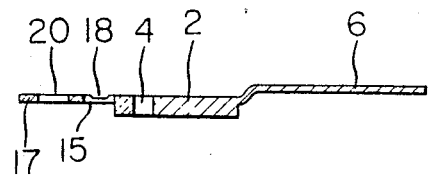

FIGS. 5A and 5B are views illustrating the structure of a lead frame according to the present invention in which FIG. 5A is a plan view thereof and FIG. 5B is a sectional view thereof along the line U—U.

Two strips 15 and 16 extend from a side of the substrate support 2 which is opposite to the side to which the external lead 6 is connected. The strips 15 and 16 are connected to a second connecting band 17. Portions 18 and 19 of small cross-sectional areas are formed at the strips 15 and 16, respectively. Apertures 20 formed in the second connecting band 17 fit with parts of a mold for alignment in the plastic encapsulation process. As shown in FIG. 5B, the thickness of the strips 15 and 16 is smaller than that of the substrate support 2. A predetermined step is formed between the rear surfaces of the strips 15 and 16 and the rear surface of the substrate support 2. Thus, the portions 18 and 19 are thinner than any other portions.

Figure 6:
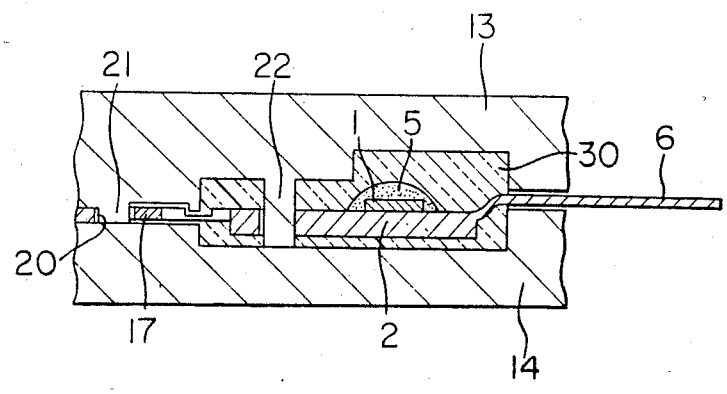
FIGS. 6, 7 and 8 are views illustrating the plastic encapsulation process to the completion of manufacture according to a method for manufacturing the plastic encapsulated semiconductor device of the present invention.

FIG. 6 is a view illustrating the state of plastic encapsulation of the transistor assembly formed by using the lead frame according to the present invention. The plastic 30 is injected into the cavity formed between the upper and lower molds 13 and 14 in the same manner as in the conventional plastic encapsulation. However, when the lead frame according to the present invention is used, as shown in the figure, the external lead 6 of the lead frame is clamped by the upper and lower molds 13 and 14 on one side. At the same time, the strips 15 and 16 and the second connecting band 17 are clamped by the upper and lower molds 13 and 14 on the other side. Projections (not shown) of the upper mold 13 fit in the apertures 8 formed in the first connecting band 9. Simultaneously, projections 21 of the upper mold 13 fit in the apertures 20 of the second connecting band 17. Reference numeral 22 denotes a projection of the upper mole 13 which forms a through hole for mounting the semiconductor device to a radiator with a screw.

According to the present invention, the substrate support 2 of the lead frame is supported by the external lead 6 and the strips 15 and 16 which are clamped by the upper and lower molds 13 and 14, and thus floats in the cavity of the molds. The first and second connecting bands 9 and 17 are clamped by the upper and lower molds 13 and 14, as described above. Further, since the projections of the upper mold 13 are fitted in the apertures formed in the first and second connecting bands 9 and 17, the first and second bands 9 and 17 are not allowed to move horizontally. Thus, the floating condition of the substrate support 2 is properly controlled.

As is apparent from FIG. 6, the cavity formed by the upper and lower molds 13 and 14 terminates at a small cross-sectional area portion 18 (19) of the strip 15 (16). Therefore, the small cross-sectional area portion 18 (19) of the strips 15 (16) extends from the encapsulating housing to the outside after plastic encapsulation is completed. In accordance with the shape of the extending portion of the strips, effects to be described later will be obtained in the cutting operation.

Figure 7:
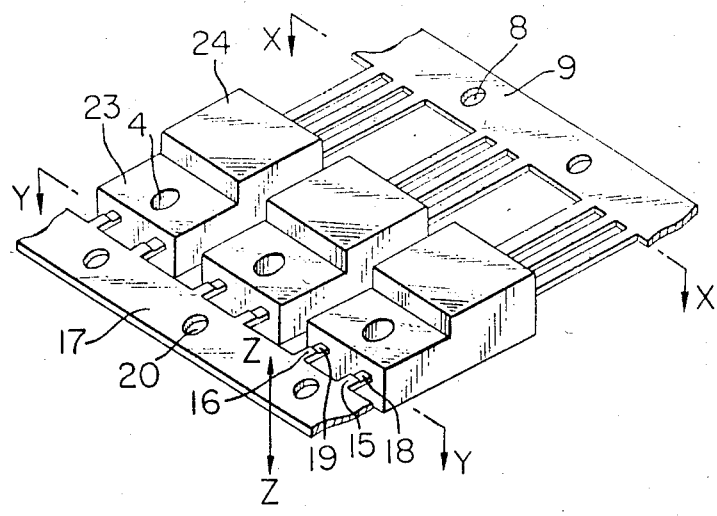

FIG. 7 is a perspective view illustrating the condition after the plastic encapsulation is completed. As shown in the figure, the plastic encapsulating housing has a thin portion 23 with the through hole 4 for a screw disposed therein and a thick portion 24. A step is formed between the thin portion 23 and the thick portion 24. The head of the screw mounted in the through hole 4 does not extend higher than the top of the thick portion 24.

Figure 8:
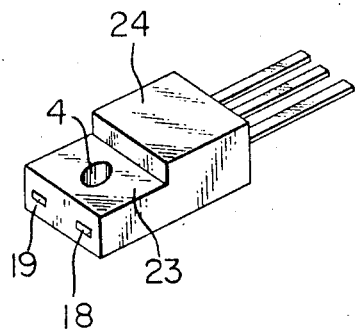

The external leads 6, 10 and 11 are cut from the first connecting band 9 along the line X—X and the strips 15 and 16 are cut at the portions 18 and 19 of small cross-sectional areas along the line Y—Y so as to produce a plastic encapsulated transistor shown in FIG. 8. Since the portions 18 and 19 extending from the thin portion 23 of the plastic encapsulating housing have cross-sectional areas smaller than those of other portions, the strips 15 and 16 are easily cut along the line Y—Y when bent in the vertical direction indicated by an arrow Z—Z. Since the portions 18 and 19 are partially exposed at the end face of the thin portion 23 of the plastic encapsulating housing, the thickness of the strips 15 and 16 is thinner at the end face of the plastic encapsulating housing. Further, since a step is formed between the portion 18 and the strip 15 and between the portion 19 and the strip 16, the substrate support 2 is brought into contact with the plastic material at a relatively long length from the end face of the plastic encapsulating housing to the transistor element 1. Therefore, water or the like may not enter through the cut surface. The strips 15 and 16 may be cut by a press machine or the like. However, in order to substantially align the cut surface of the strip with the end face of the plastic encapsulating housing with high precision, it is preferable to bend and cut the strips by brittle fracture under bending stress because cutting by the press machine may damage the encapsulating housing, resulting in poor appearance.

In the transistor manufactured according to the method of the present invention, the cut surfaces of the strips 15 and 16 are exposed at the end face of the plastic encapsulating housing. However, since the step is formed between the rear surface of the substrate support 2 and the rear surface of the strips 15 and 16, as shown in FIG. 5, a sufficient space is formed between the cut surfaces and the rear surface of the plastic encapsulating housing which is mounted to the radiator. Short-circuiting does not occur at the cut surfaces of the strips.

Figure 9:
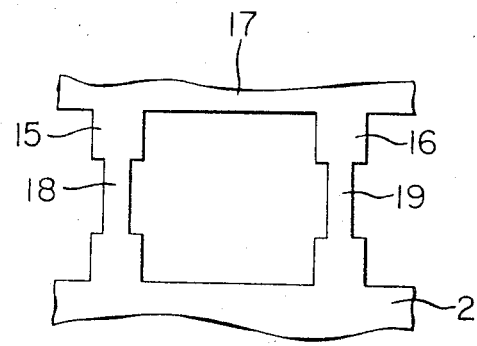
FIGS. 9 and 10 are views showing examples of portions of the strips with small cross-sectional areas respectively.
Figure 10:
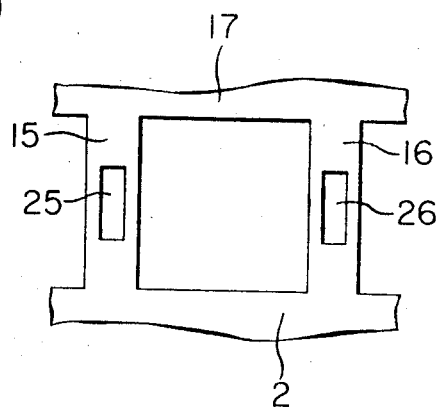

In the above embodiment, parts of the strips 15 and 16 are made thin in order to reduce the cross-sectional areas of the strips at these parts. However, as shown in FIG. 9, the thickness of the strips may be kept constant but parts thereof may be narrowed for this purpose. Alternatively, as shown in FIG. 10, holes 25 and 26 may be formed in the strips 15 and 16, respectively, to substantially partially reduce the width of the strips 15 and 16. The plastic for plastic capsulation used according to the method of the present invention preferably has high thermal conductivity. The thickness of the plastic layer immediately under the substrate support is preferably 0.3 to 0.5 mm in consideration of heat radiation and electrical insulation. With the thickness within this range, better results are obtained.

In the plastic encapsulated semiconductor device with an insulation structure formed by the process described above, as is also apparent from FIG. 6, a thin layer of plastic 30 is formed on the rear surface of the substrate support, to the upper surface of which the transistor element 1 is adhered. The layer of plastic 30 has thermal conductivity lower than that of the substrate support 2 comprising a metal plate. Therefore, the plastic layer on the rear surface of the substrate support 2 must be as thin as possible and must comprise a plastic of very high thermal conductivity. In consideration of this, although a very thin plastic layer is formed on the rear surface of the substrate support 2, the plastic film may peel off the substrate support 2 due to heat shrinkage therebetween, thus resulting in changes of heat dissipation characteristic over time, degradation of resistance to humidity, degradation of mechanical strength, and degradation of electrical insulation.

The present invention provides a plastic encapsulated semiconductor device with an insulation structure which eliminates the above problem. The characteristic feature of the present invention resides in that grooves or bores are formed in at least part of a surface opposing the semiconductor substrate adhered surface of the substrate support connected to one of the external leads extending in the same direction from the connecting band.

Figure 11A:
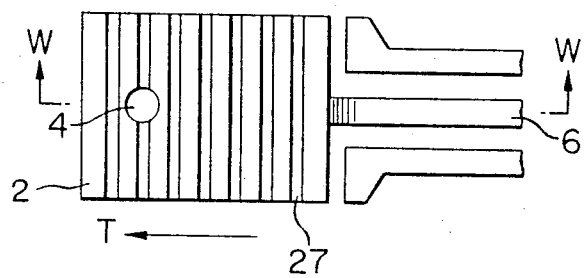
FIGS. 11A and 11B are a plan view and a sectional view, respectively, of the main part of a lead frame according to another embodiment of the present invention.
Figure 11B:
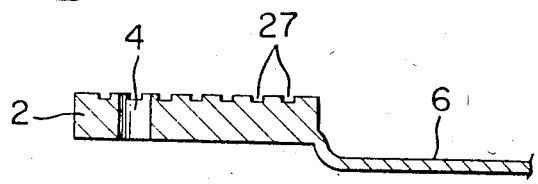

The above feature will be described in detail with reference to the accompanying drawings. FIG. 11A is a plan view of the main part of a lead frame for a plastic encapsulated semiconductor device according to another embodiment of the present invention, and FIG. 11B is a sectional view thereof along the line W—W of FIG. 11A. A plurality of grooves 27 are formed perpendicularly to the direction indicated by an arrow T. The width, depth and pitch of these grooves are not limited but may be changed as needed. When a thin plastic layer is formed on a three-dimensional surface, the surface area of the substrate support which is brought into contact with the plastic layer is increased. Therefore, heat dissipation characteristics are, of course, improved and the plastic layer is strongly adhered to the substrate support 2. Thus, the plastic layer does not peel off the substrate support 2, although the layer tends to peel off the flat surface of the substrate support 2.

An increase in the surface area is proportional to the total area of inner walls of the grooves. Assume that the number of grooves is defined as n, the length of each groove is defined as l, and the depth of the grooves is defined as d. An increase $\Delta S$ of the surface area is given by the relation: $\Delta S = 2nld$. For example, assume that fifteen parallel grooves of 200 $\mu$m width and 100 $\mu$m depth are formed in a substrate support of 15 mm length and 10 mm width. The surface area is calculated as $150 + (2 \times 15 \times 10 \times 0.1) = 180$ mm$^2$, whereas the surface area of the substrate support without grooves is calculated as 150 mm$^2$. Thus, an increase $\Delta S$ of 20% is obtained.

Figure 12:
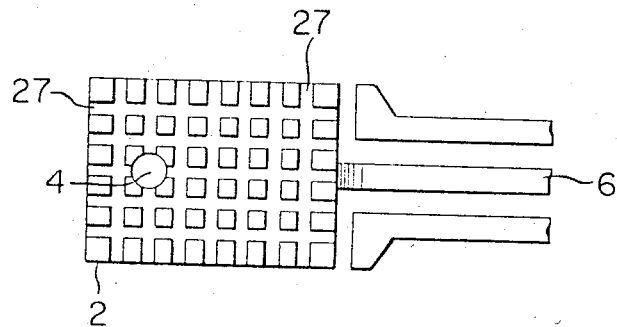
FIGS. 12, 13 and 14 are plan views of the main part of a lead frame according to still another embodiment of the present invention, respectively.
Figure 13:
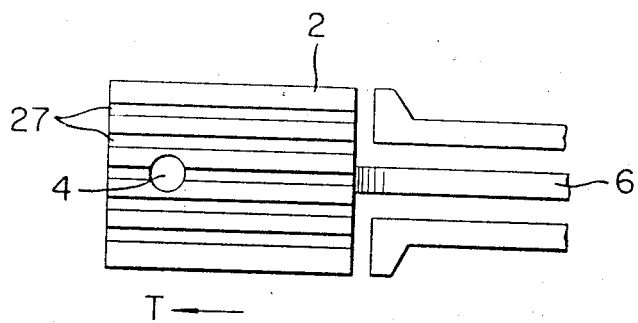
Figure 14:
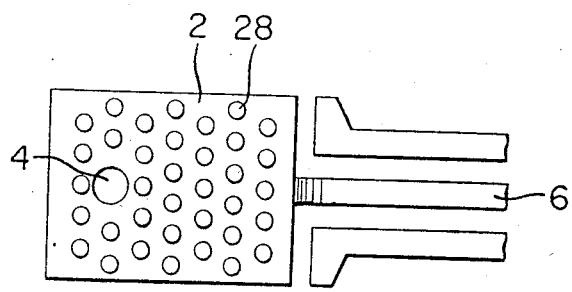

FIGS. 12, 13 and 14 show other examples of three-dimensionally patterned surface of the substrate support 2, respectively. A plurality of grooves 27 are formed in a lattice shape on the rear surface of the substrate support 2 in FIG. 12; a plurality of grooves 27 parallel to the direction indicated by the arrow T are formed thereon in FIG. 13; and a plurality of bores each of which has predetermined diameter and depth are formed thereon in FIG. 14. The same effects as described above are obtained in all modifications of the grooves 27. Further, the plastic is injected in the molds in the direction indicated by the arrow T. If the three-dimensional patterning process as shown in FIG. 13 is performed, the flow of the plastic in the molds is very smooth, so voids or the like are easily eliminated, resulting in good appearance and the improvement of electrical insulation of the device.

As is apparent from the above description, a plastic encapsulated semiconductor device which has a thin plastic layer immediately under the substrate support which also serves as the heat sink is manufactured with high precision according to the present invention.

What is claimed is:

1. A lead frame comprising a first connecting band, a plurality of external leads extending in one direction from said first connecting band, a substrate support having a rear surface and which serves as a heat sink connected at one side thereof to a free end of one of said external leads, a plurality of support strips, each having a portion of small cross-sectional area and being of a predetermined length and extending in a lengthwise direction between portions of larger cross-sectional areas of the respective strip, the cross sections of said portions of small cross-sectional areas being taken perpendicular to said lengthwise direction of said strips, and one end of said strip is connected to another side of said substrate support opposite to the one side connected to said external leads, and a second connecting band extending parallel to said first connecting band with said substrate support disposed therebetween, and connected to opposite ends of said strips, said strips having a smaller thickness than said substrate support and rear surfaces of said strips being at a higher level than the rear surface of said substrate support.

2. A lead frame according to claim 1, wherein two strips are connected to each said substrate support.

3. A lead frame according to claim 1, wherein said portions of small cross-sectional areas of said strips have narrowed portions, respectively, to reduce the cross-sectional areas of said portions of said strips.

4. A lead frame according to claim 1, wherein said strips have apertures, respectively, to substantially reduce the cross-sectional areas of said portions of small cross-sectional areas of said strips.

5. A lead frame according to claim 1, wherein a plurality of apertures are formed in each of said first and second connecting bands at an equal pitch.

6. A lead frame according to claim 1, wherein a three-dimensional pattern of one of a groove shape and a bore shape is formed on at least part of one surface of said substrate support and an opposite surface of which supports a semiconductor substrate.

7. A lead frame according to claim 6, wherein said three-dimensional pattern has grooves extending perpendicular to a longitudinal direction of said substrate support.

8. A lead frame according to claim 6, wherein said three-dimensional pattern has grooves in a lattice form.

9. A lead frame according to claim 6, wherein said three-dimensional pattern has grooves extending parallel to a longitudinal direction of said substrate support.

10. A lead frame according to claim 6, wherein said three-dimensional pattern has a number of bores.

* * * * *